(12) United States Patent
Hofmann et al.

(10) Patent No.: US 6,399,433 B2
(45) Date of Patent: Jun. 4, 2002

(54) METHOD FOR FABRICATING A MEMORY CELL

(75) Inventors: Franz Hofmann, München; Wolfgang Krautschneider, Hamburg; Till Schlösser, München; Josef Willer, Riemerling, all of (DE)

(73) Assignee: Infineon Technologies AG, Muenchen (DE)

( * ) Notice: Subject to any disclaimer, the term of this patent is extended or adjusted under 35 U.S.C. 154(b) by 0 days.

(21) Appl. No.: 09/773,218

(22) Filed: Jan. 31, 2001

Related U.S. Application Data

(63) Continuation of application No. PCT/DE99/02080, filed on Jul. 5, 1999.

(30) Foreign Application Priority Data

Jul. 31, 1998 (DE) .......................................... 198 34 649

(51) Int. Cl.[7] .................. H01L 21/8242; H01L 27/108
(52) U.S. Cl. ........................................ 438/240; 438/241
(58) Field of Search ................................ 438/240, 241, 438/396, 399

(56) References Cited

U.S. PATENT DOCUMENTS 5,701,647 A   12/1997  Saenger et al.
5,757,612 A   5/1998   Acosta et al.
5,793,076 A   8/1998   Fazan et al.

FOREIGN PATENT DOCUMENTS

DE   196 40 273 C1   3/1998
WO   WO 00/08682     2/2000

Primary Examiner—Amir Zarabian
Assistant Examiner—Beth E. Owens
(74) Attorney, Agent, or Firm—Laurence A. Greenberg; Werner H. Stemer; Ralph E. Locher

(57) ABSTRACT

A method for producing a storage cell includes forming a polycrystalline silicon layer on a semiconductor body having at least one selection transistor disposed in a first plane. An interspace is formed between two adjacent structures of the layer and one of the adjacent structures of the layer is placed on a surface of a first silicon plug. A cell plate electrode is formed in the interspace and a trench is formed in the layer. The trench reaches as far as the first plug surface and is filled with an insulating layer. The-layer is removed. A storage capacitor having a high-epsilon or ferroelectric dielectric and a storage node electrode is formed. The capacitor is disposed in a second plane in and above the body. The insulating layer is replaced with silicon to form a second silicon plug directly connected to the first plug. The second plug is electrically connected to the storage node electrode, and the first plane is electrically connected to the second plane through the first and second plugs.

10 Claims, 8 Drawing Sheets

METHOD FOR FABRICATING A MEMORY CELL

CROSS-REFERENCE TO RELATED APPLICATION

This application is a continuation of copending International Application No. FCT/DE99/02080, filed Jul. 5, 1999, which designated the United States.

BACKGROUND OF THE INVENTION

Field of the Invention

The present invention relates to a method for fabricating a memory cell including at least one selection transistor and a storage capacitor having a high-epsilon or ferroelectric dielectric. The selection transistor is disposed in a first plane and the storage capacitor is disposed in a second plane in and, respectively, above a semiconductor body. The first plane is electrically connected to the second plane by a first plug made of silicon, which is adjoined by a second plug made of silicon, which is electrically connected to a storage node electrode of the storage capacitor.

A prior art memory cell is disclosed in German Published, Non-Prosecuted Patent Application DE 195 40 213A1. Additionally, German Patent DE 195 43 539 C1 describes a method for fabricating a memory configuration in which first plugs are introduced into a first insulating layer proposed on a semi-conductor body. Second plugs are then provided above the first plugs in a second insulating layer applied on the first insulating layer.

In the fabrication of such memory cells, the dielectric made of high-epsilon or ferroelectric material, such as, for example, barium strontium titanate (BST) or bismuth barium tantalate (SBT), requires heat treatment with oxygen. During such heat treatment, however, every uncovered silicon layer is oxidized, resulting in the loss of its electrical conductivity. In memory cells, polycrystalline silicon is used in plugs to connect the selection transistor to an electrode of the stacked storage capacitor disposed above it. These plugs are connecting layers that ensure an electrical connection between the storage capacitor and the selection transistor. In order then to prevent the oxidation of the polycrystalline silicon in the plug between selection transistor and storage capacitor during the heat treatment of BST or SBT, the surface of the plug has hitherto usually been coated with a barrier layer in order to prevent oxygen diffusion to the polycrystalline silicon from taking place. However, it is difficult and also costly to find suitable materials for such barrier layers because the layers have to withstand high temperatures in the region of 700° C. and 800° C. during the heat treatment of BST and SBT.

SUMMARY OF THE INVENTION

It is accordingly an object of the invention to provide a method for fabricating a memory cell that overcomes the hereinafore-mentioned disadvantages of the heretofore-known devices and methods of this general type and in which, without using a barrier layer, the selection transistor can be electrically well-connected to the storage capacitor such that oxidation of silicon cannot occur.

With the foregoing and other objects in view, there is provided, in accordance with the invention, a method for fabricating a memory cell, including the steps of forming a polycrystalline silicon layer on a semiconductor body having at least one selection transistor disposed in a first plane, forming an interspace between two adjacent structures of the polycrystalline silicon layer, placing one of the adjacent structures of the polycrystalline silicon layer on a surface of a first silicon plug, forming a cell plate electrode in the interspace, forming a trench in the polycrystalline silicon layer, the trench reaching as far as the surface of the first plug, and filling the trench with an insulating layer, removing the polycrystalline silicon layer, forming a storage capacitor having one of a high-epsilon and ferroelectric dielectric and a storage node electrode, the storage capacitor being disposed in a second plane in and, respectively, above the semiconductor body, and replacing the insulating layer with silicon to form a second silicon plug directly connected to the first plug, the second plug being electrically connected to the storage node electrode, and the first plane being electrically connected to the second plane through the first and second plugs.

The method for fabricating a memory cell according to the invention achieves its objective by virtue of the fact that, before the application of the dielectric and after the formation of a cell plate electrode for the storage capacitor, a surface of the first plug that is uncovered in a window of a polycrystalline silicon layer is covered with an insulating layer as spacer. Then, the dielectric and subsequently storage node electrodes are formed. Finally, the insulating layer is replaced by silicon, which forms the second plug directly connected to the first plug.

The first plug and the second plug are preferably formed from polycrystalline silicon. As an alternative, they may also be formed from amorphous silicon.

In accordance with another mode of the invention, a lateral edge web is formed on a structure of the polycrystalline silicon layer.

In accordance with a further mode of the invention, a cell plate electrode is formed from a conformal layer and a filling.

In accordance with an added mode of the invention, a cell plate electrode is formed from a conformal layer and a filling.

In accordance with an additional mode of the invention, the insulating layer is formed from at least one of the group consisting of silicon oxide, silicon nitride, and silicon oxide-nitride. Preferably, the insulating layer is formed from silicon nitride.

For the method according to the invention, the cell plate electrode of the storage capacitors is produced by an auxiliary structure in the shape of a reticulated pattern. Contact holes for the cell node connection are then etched into the auxiliary structure, which is preferably formed from polycrystalline silicon. The contact holes are subsequently filled with an insulating layer, for example, made of silicon nitride, as a spacer. The fabrication of the storage capacitor then follows, in which an oxidizing heat treatment of BST or SBT at high temperatures can be performed in a straightforward manner because the plug leading away from the selection transistor is still covered with the insulating layer at this time, so that oxidation of the silicon of the plug is reliably avoided. The silicon forming the second plug replaces the "spacer" made of the insulating layer only after the heat treatment.

In accordance with yet another mode of the invention, at least one of the cell plate electrode and the storage node electrode is formed by chemical vapor deposition.

In accordance with yet a further mode of the invention, at least one of the cell plate electrode and the storage node electrode is formed by sputtering.

The electrodes themselves can be formed, for example, by chemical vapor deposition (CVD) of ruthenium (Ru) or, alternatively, by sputtering platinum (Pt) and filling the shrink holes with tungsten. Instead of ruthenium, platinum and tungsten, it is also possible to use other materials, such as those specified, in particular, in U.S. Pat. No. 5,554,866 to Nishioka et al.

With the objects of the invention in view, there is also provided a method for fabricating a memory cell, including the steps of forming a memory cell having a semiconductor body with at least one selection transistor disposed in a first plane and a storage capacitor, the storage capacitor having a storage node electrode and one of a high-epsilon and ferroelectric dielectric, the storage capacitor being disposed in a second plane in and, respectively, above the semiconductor body, and electrically connecting the first plane to the second plane with a first silicon plug by adjoining the first plug to a second silicon plug and by electrically connecting the second plug to the storage node electrode, the forming step including the steps of forming a polycrystalline silicon layer on the semiconductor body, the polycrystalline silicon layer having an interspace between two adjacent structures of the polycrystalline silicon layer, one of the adjacent structures of the polycrystalline silicon layer being disposed on a surface of the first plug, forming a cell plate electrode in the interspace forming a trench in the polycrystalline silicon layer, the trench reaching as far as the surface of: the first plug, and filling the trench with an insulating layer, removing the polycrystalline silicon layer, forming the dielectric and the storage node electrode, and replacing the insulating layer with silicon to form the second plug directly connected to the first plug.

Other features that are considered as characteristic for the invention are set forth in the appended claims.

Although the invention is illustrated and described herein as embodied in a method for fabricating a memory cell, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Figure 1:
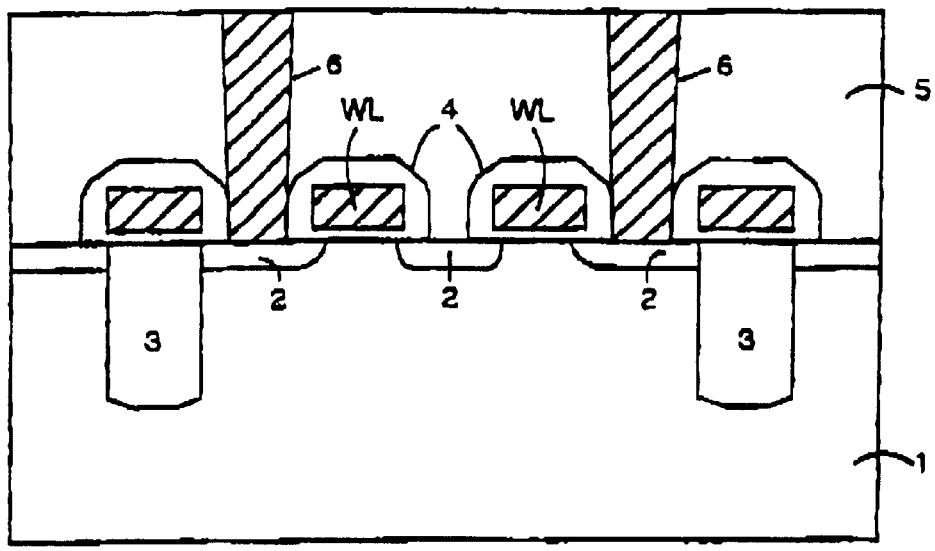
FIGS. 1 to 7 are cross-sectional diagrammatic representations of a first exemplary embodiment of the method for fabricating a memory cell according to the invention.

In all the figures of the drawing, sub-features and integral parts that correspond to one another bear the same reference symbol in each case.

The steps of the first exemplary embodiment, which are explained with reference to FIGS. 1 and 2 also apply to the second exemplary embodiment and, in order to simplify the explanation, are described only with reference to the first exemplary embodiment.

It is also the case that in the cross-sectional diagrams of FIGS. 1 to 7 and 9 to 14, only individual parts are shown hatched in order to impart as much clarity as possible to the drawings.

Referring now to the figures of the drawings in detail and first, particularly to FIG. 1 thereof, there is shown a p-conducting semiconductor body 1 in which $n^+$-conducting regions 2 are embedded as source and drain between insulations 3 made, for example, of silicon dioxide. Provided above the semiconductor body 1 are word lines WL in insulating material 4 made, for example, of silicon dioxide; bit lines run in front of and behind the plane of the drawing perpendicular to the word lines WL and are not shown in the cross-sectional illustrations of the figures.

An intermediate oxide layer 5 made, for example, of silicon dioxide is also situated on the surface of the semiconductor body 1, through which layer extend first plugs 6 made of doped polycrystalline silicon for making contact with the regions 2.

Figure 2:
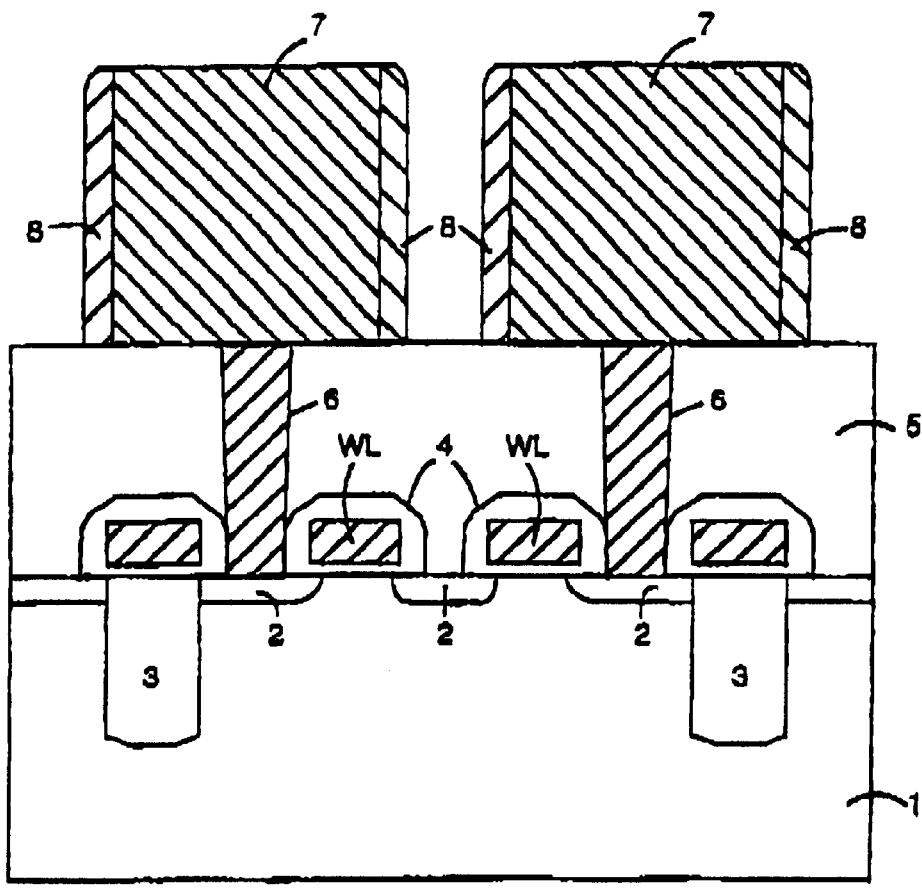

As shown in FIG. 2, polycrystalline silicon with a layer thickness of 500 nm is deposited onto the configuration thus fabricated, and is patterned with the aid of a photolithographic and etching technique, so that after the resist has been removed, polycrystalline silicon layers 7 remain in the region above the first plugs 6. If appropriate, these polycrystalline silicon layers 7 may also be strengthened with spacer layers 8 having a layer thickness of about 50 nm. However, these layers 8 do not have to be applied.

Ruthenium is then deposited by CVD with a layer thickness of about 100 nm and subjected to chemical mechanical polishing, so that ruthenium layers 9 remain in the "gaps" between the layers 7 and 8.

Figure 3:
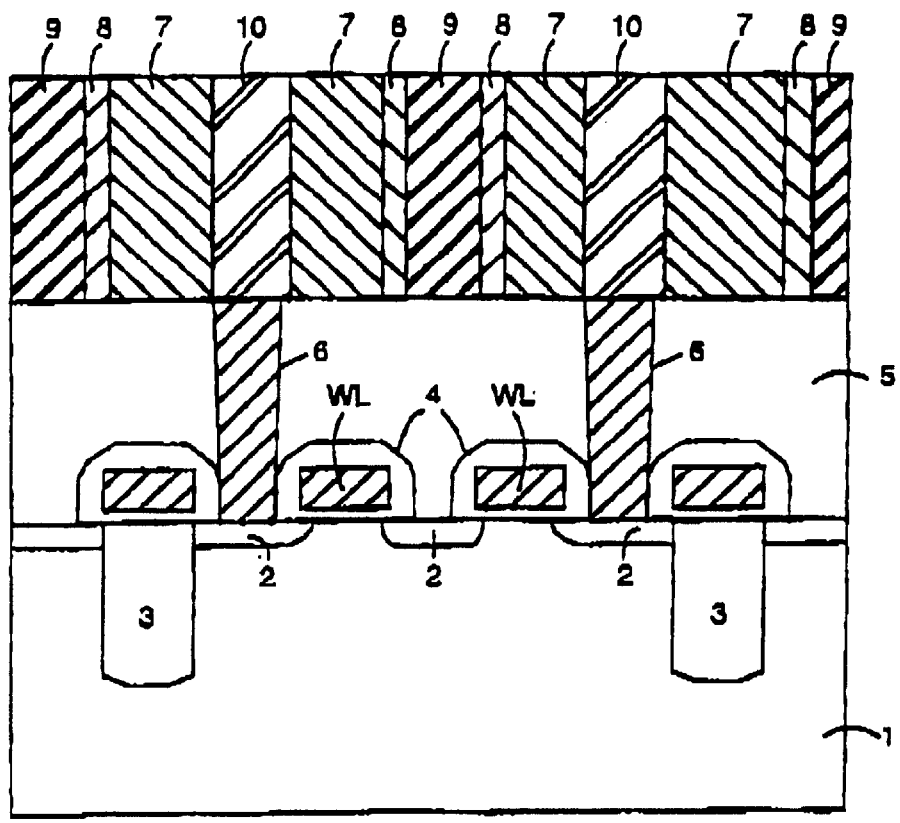

By a further photolithographic and etching technique, holes are etched into the polycrystalline silicon layers 7 in the region directly above the plugs 6, which holes are filled with insulating material made, for example, of silicon nitride, so that insulating layers 10 are formed in these holes directly above the first plugs 6. Thus, after etching back of the silicon nitride, the structure shown in FIG. 3 is produced.

Figure 4:
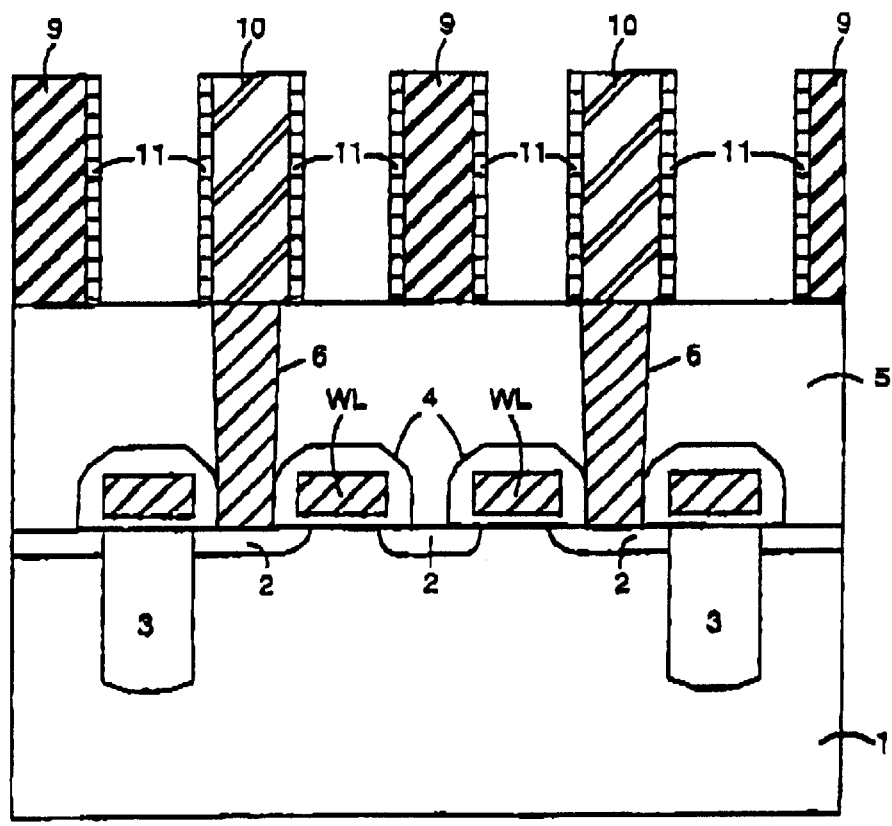

The polycrystalline silicon layers 7, 8 are subsequently removed by wet etching, so that only the ruthenium layers 9 and the insulating layers 10 remain. A dielectric, such as BST, for example, is deposited onto the structure thus obtained, and is subsequently patterned by etching such that it remains only on. the side walls of the trenches and forms a dielectric 11 there. Thus, the structure shown in FIG. 4 is obtained.

Figure 5:
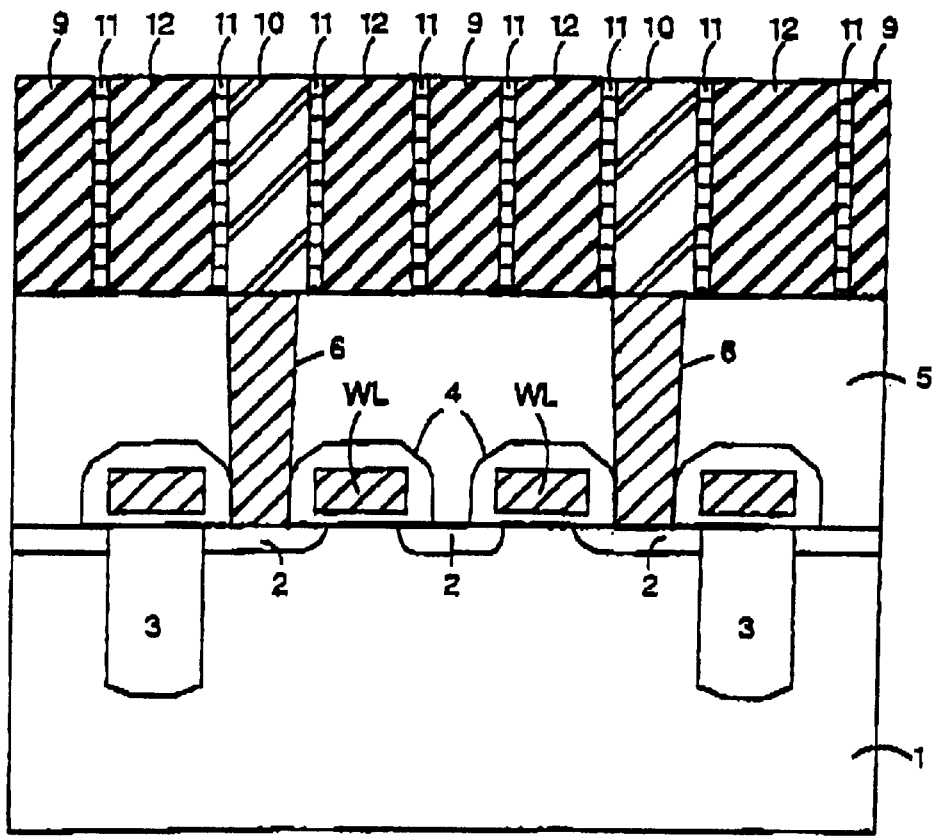

By CVD, ruthenium with a layer thickness of about 200 nm is then once more introduced into the trenches between the dielectrics 11 and subjected to chemical mechanical polishing, thereby obtaining the structure shown in FIG. 5 and in which ruthenium electrodes 12 are disposed on both sides of the BST dielectrics 11.

Figure 6:
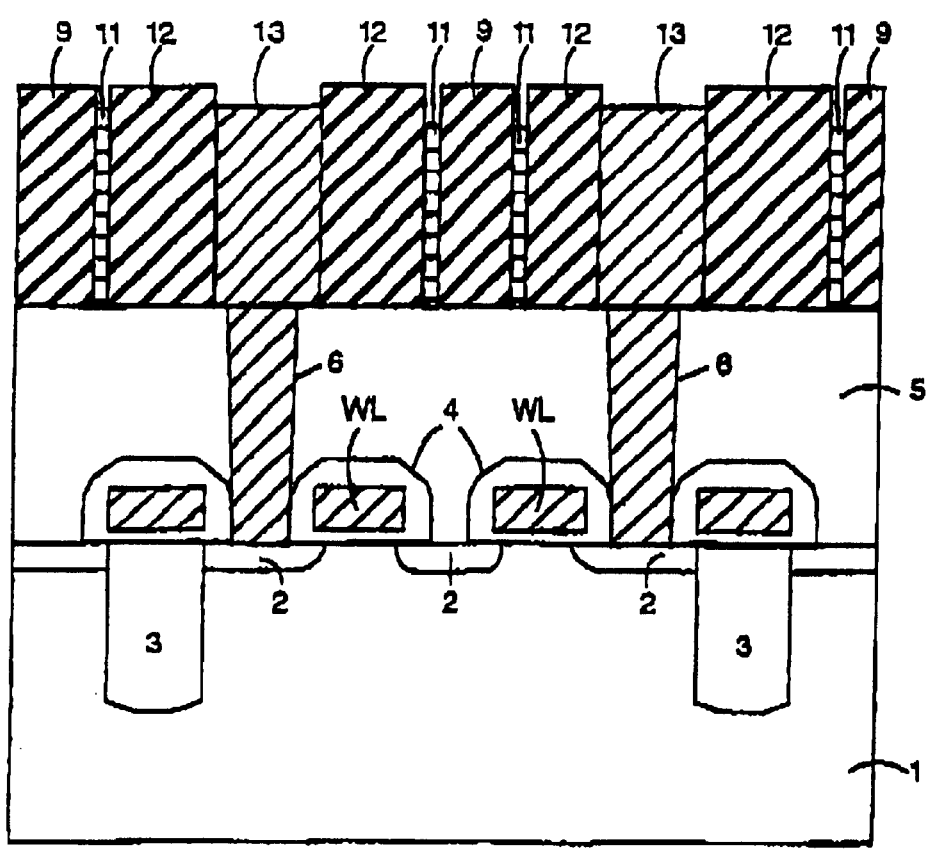

The silicon nitride layer 10 serving as a "spacer" is subsequently removed by wet etching. The silicon nitride layer 10 protected the plugs 6 against oxidation with oxygen during the heat treatment of the BST dielectrics 11 (cf. FIG. 4). After the removal of the silicon nitride layer 10 and the wet etching of the BST dielectrics 11 adjoining the silicon nitride layer 10, the trenches thus formed are filled with doped polycrystalline silicon, thereby producing second plugs 13 directly connected to the first plugs 6. The plugs 6, 13 are n+-doped, if appropriate. After the etching back of the plugs 13, the structure shown in FIG. 6 is obtained.

Figure 7:
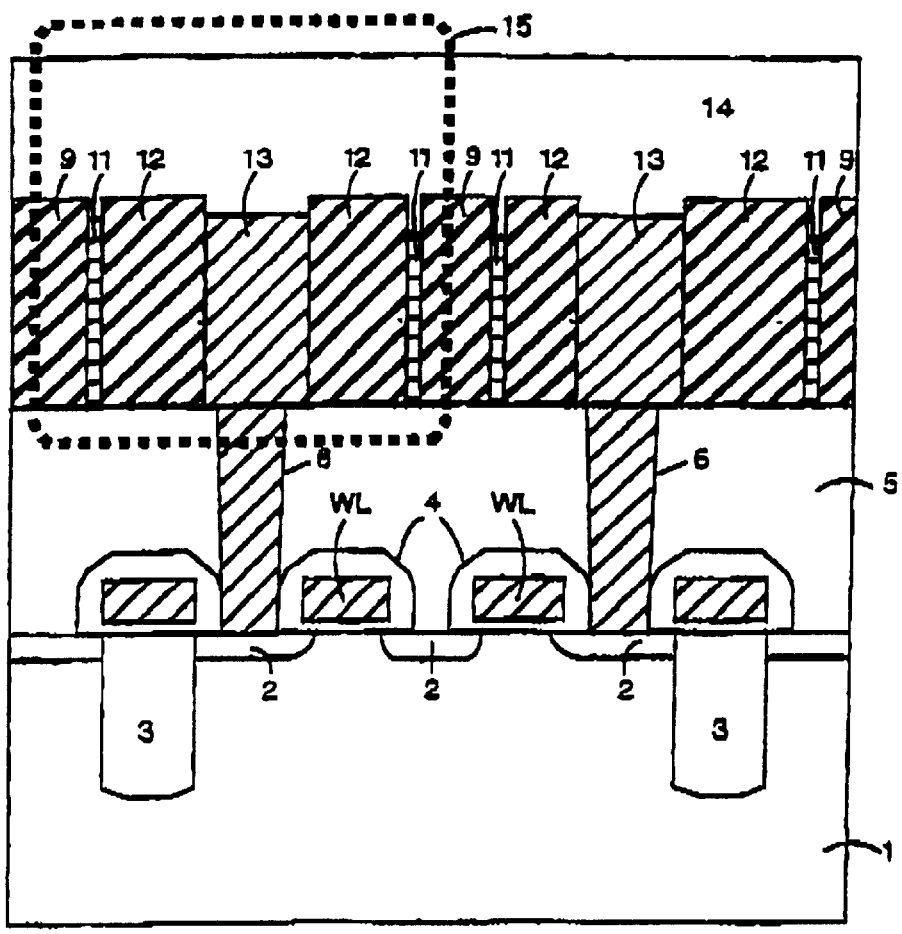

A TEOS deposition (TEOS=tetraethylene orthosilicate) also follows to form a silicon dioxide layer 14, resulting in the structure shown in FIG. 7 and in which a capacitor 15 of an individual cell has been separately emphasized.

Figure 8:
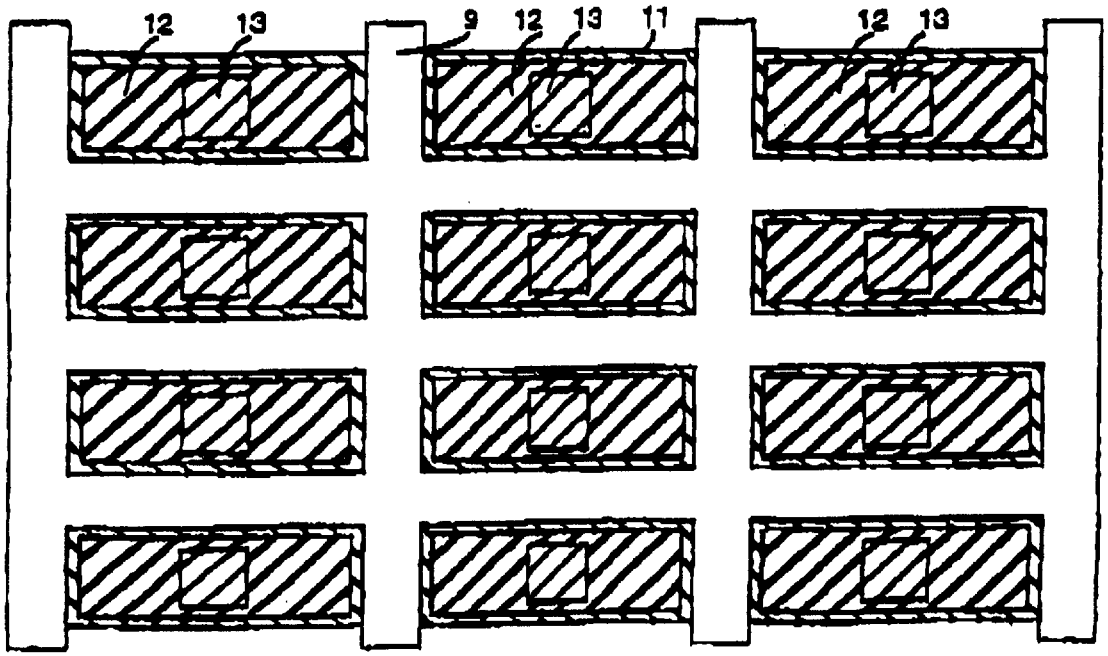
FIG. 8 is a plan view of a memory cell fabricated according to the first exemplary embodiment of the invention.

FIG. 8 shows a plan view of memory cells obtained by the method according to the invention, with the ruthenium layers 9 forming a reticulated pattern, the second plugs 13, the BST dielectrics 11 and ruthenium nodes 12 (formed by the ruthenium layers 12 adjoining the plugs 13). The reticulated ruthenium layers 9 form a cell plate electrode of the storage capacitors.

It shall be noted that FIGS. 1 to 7 show cross-sections through FIG. 8 in a horizontal direction, although these sections do not reproduce the individual structures of FIG. 8 on the same scale in each case.

In the following text, FIGS. 9 to 15 are used to explain a second embodiment of the method for fabricating a memory cell according to the invention, which follows the method steps explained above with the aid of FIGS. 1 and 2.

Figure 9:
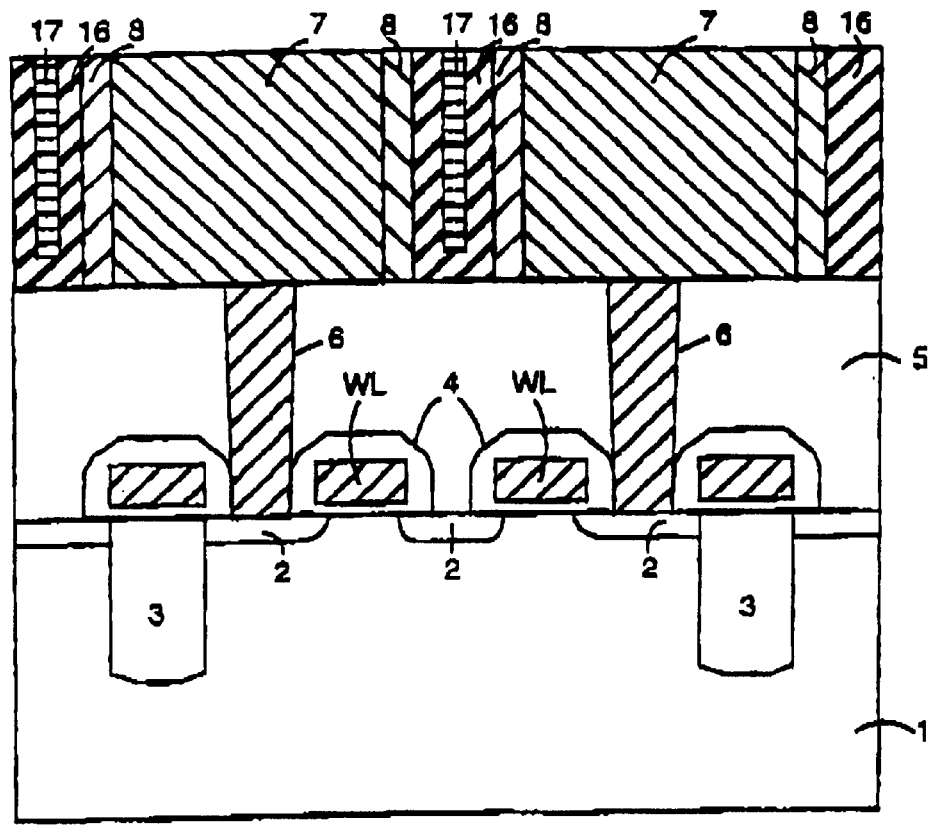
FIGS. 9 to 14 are cross-sectional diagrammatic representations of a second exemplary embodiment of the method for fabricating a memory cell according to the invention.
Figure 10:
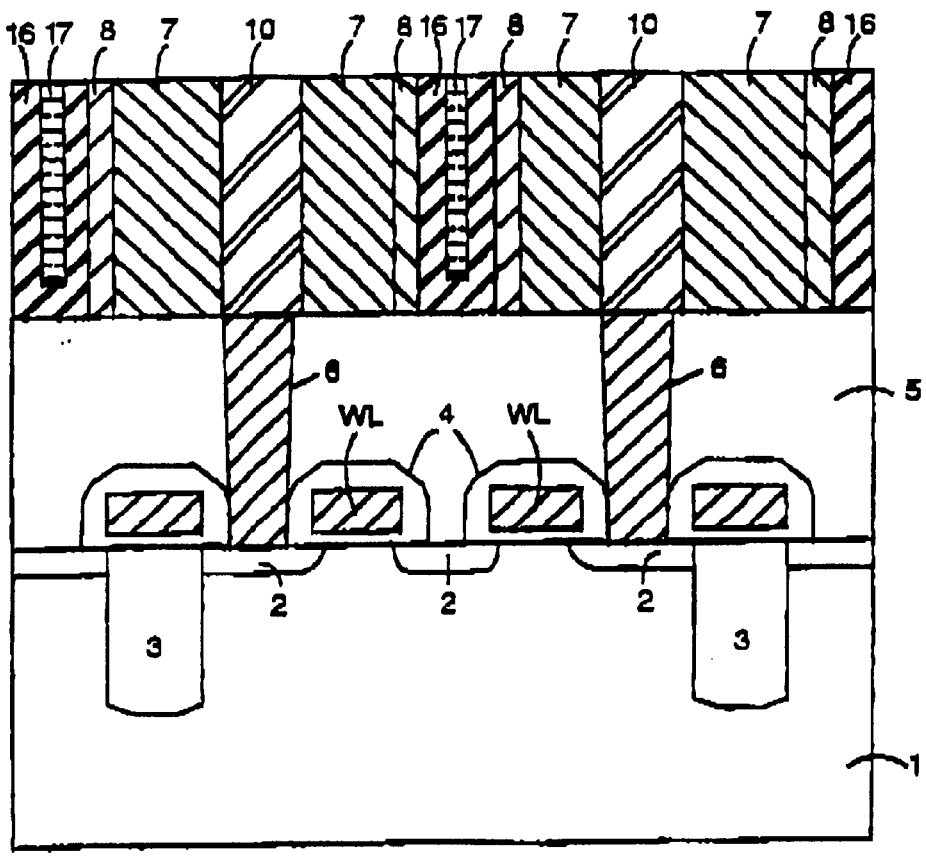

As shown in FIG. 9, the trenches between the polycrystalline silicon layers 7, 8 (cf. FIG. 2) are filled by applying a platinum layer having a thickness of 50 nm through sputtering. The platinum layer is subsequently subjected to chemical mechanical polishing to produce a platinum layer 16. The interspaces of the platinum layer 16 are filled with a tungsten layer 17 having a thickness of about 50 nm. The tungsten layer is deposited by CVD and is subsequently subjected to chemical mechanical polishing. As shown in FIG. 10, in a similar manner to that in the step of the first embodiment explained with reference to FIG. 3, the polycrystalline silicon layers 7, 8 are patterned in order to produce holes therein, which are filled with a silicon nitride layer 10. As in the first embodiment, it is the case in the second embodiment, too, that the holes or the silicon nitride layers 10 filled into the latter lie directly above the first plugs 6, so that they form a spacer there during subsequent heat treatments, in order to protect the first plugs 6 against oxidation in an oxygen atmosphere. After etching back of the silicon nitride, the structure shown in FIG. 10 is obtained.

Figure 11:
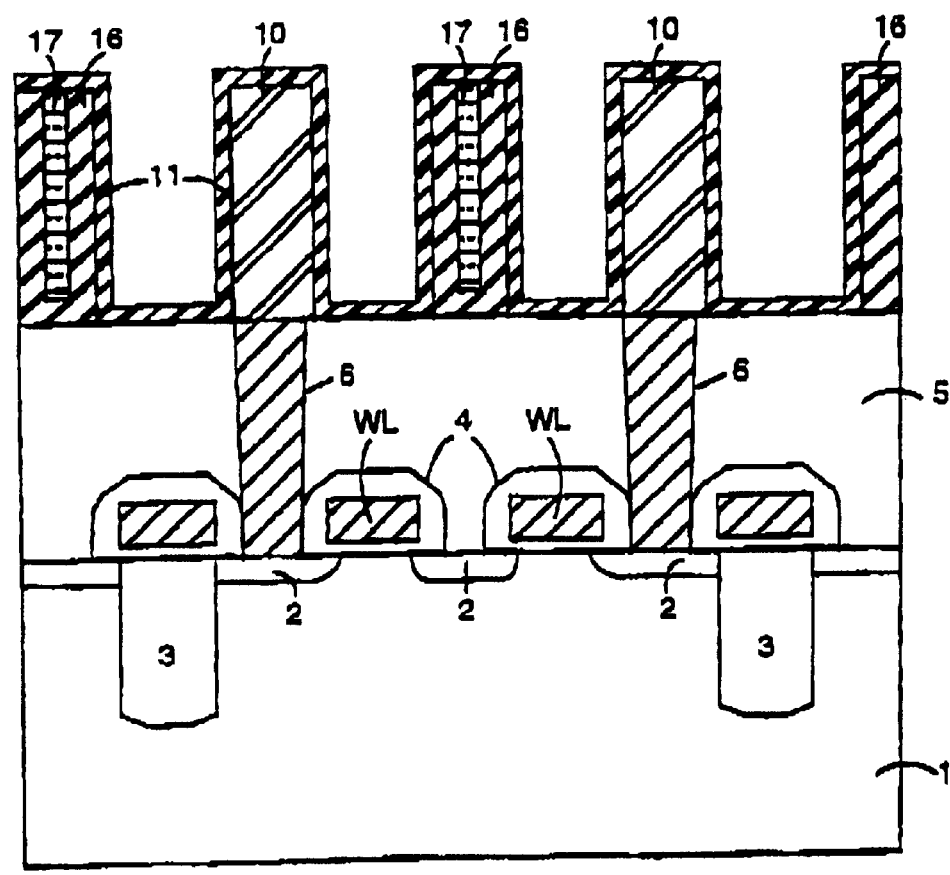
Figure 12:
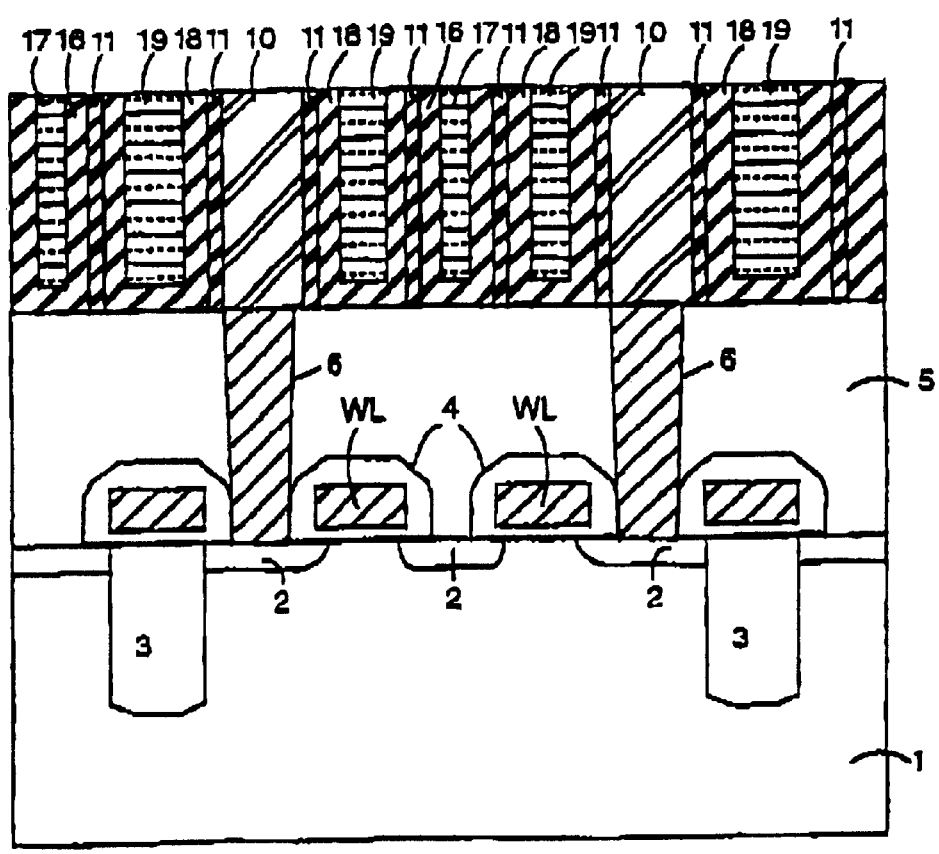

The polycrystalline silicon layers 7, 8 are subsequently removed by wet etching and BST is deposited over the whole area of the structure thus produced, resulting in the configuration having a BST dielectric 11 as shown in FIG. 11.

A platinum layer 18 is then deposited, which is subsequently subjected to chemical mechanical polishing. The BST dielectric 11 is then heat-treated. During the heat-treatment process, the silicon nitride layer 10 protects the first plugs 6, so that no oxidation occurs on the surface of the first plugs 6.

Finally, the interspaces in the platinum layer 18 are also filled with a tungsten layer 19 having a thickness of about 50nm, the tungsten layer being applied by CVD and subsequently subjected to chemical mechanical polishing. The structure shown in FIG. 12 thus results.

Figure 13:
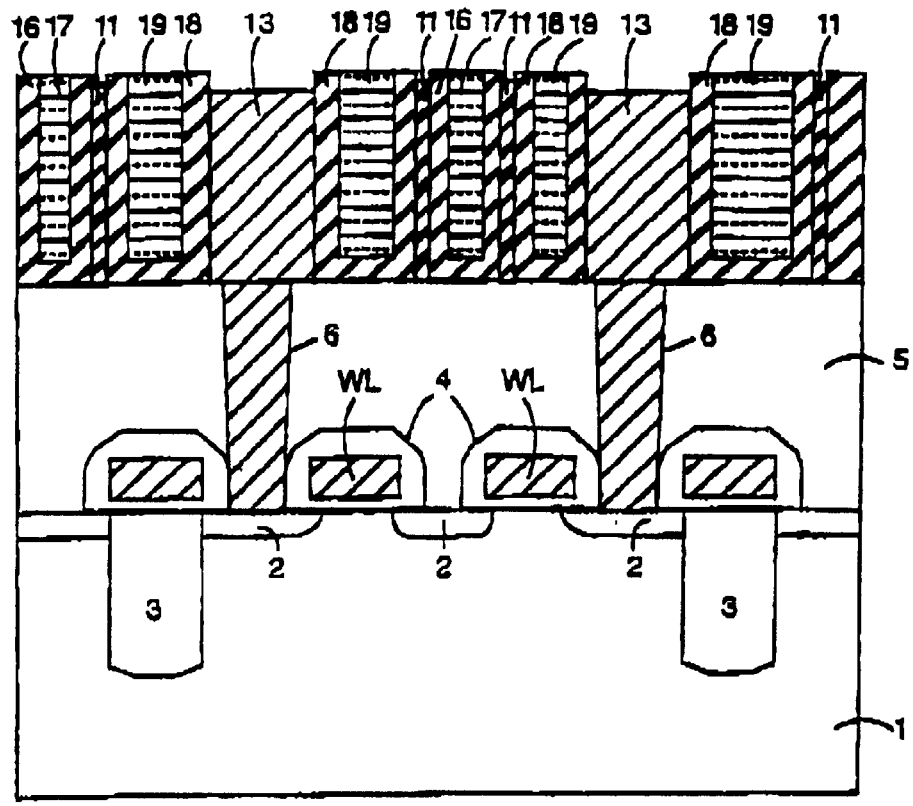
Figure 14:
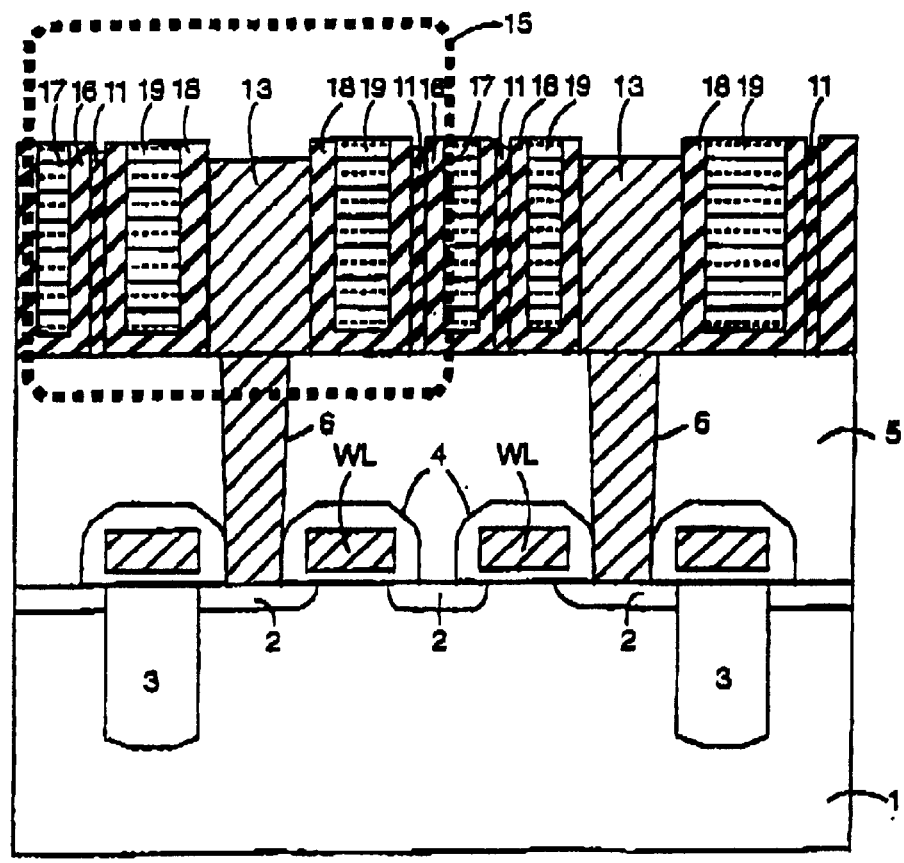

In a manner similar to the step explained with reference to FIG. 6, the silicon nitride layer 10 is then removed by wet etching. A doped polycrystalline silicon layer is then deposited, which thus forms the second plugs 13 above the first plugs 6, so that the plugs 6, 13 are in direct contact with one another. After etching back of the polycrystalline silicon, the structure shown in FIG. 13 is thus obtained.

Afterward, a non-illustrated TEOS silicon dioxide layer 14 is also applied, thereby completing the memory cell. FIG. 14 once again emphasizes a capacitor 15 of a single cell.

Figure 15:
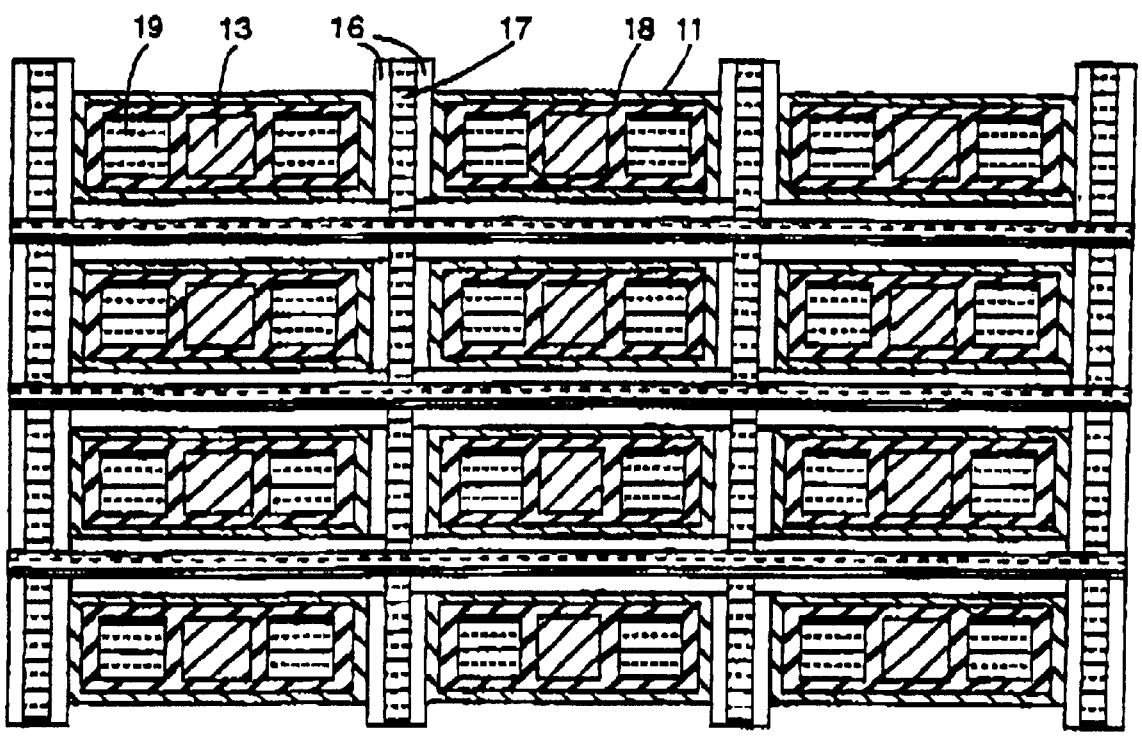
FIG. 15 is a plan view of the memory cell fabricated according to the second exemplary embodiment of the invention.

FIG. 15 shows a plan view of the memory cell obtained by the method according to the second embodiment, similar to FIG. 8 for the first embodiment. FIGS. 9 to 14 also show sections running in the horizontal direction through the configuration of FIG. 15.

Essential to the invention is that, during the heat-treatment processes, the first plugs 6 are covered by the insulating layer 10 made, for example, of silicon nitride, resulting in the first plugs not being subject to oxidation in an oxygen atmosphere. After the heat-treatment processes, the insulating layer 10 serving as spacer is removed to be replaced by doped polycrystalline silicon that then forms the second plugs 13 in direct contact with the first plugs 6.

The individual process steps are to a very great extent self-aligned with respect to one another, so that a high degree of accuracy can be achieved. Moreover, the cell area for the storage capacitor is utilized in an optimum manner. Barrier layers are not required because, as has been explained above, the insulating layer protects the polycrystalline silicon of the first plugs during the heat-treatment processes. It is noted that instead of ruthenium, platinum, and tungsten, which are used in the above embodiments, it is also possible to use other materials, such as those specifically disclosed in U.S. Pat. No. 5,554,866 to Nishioka et al.

Finally, in the invention, the cell plate electrode (cf., for example, the ruthenium layers 9 in FIGS. 3 and 4) is first produced and formed as a reticulated pattern. The contact holes for the cell node connection are then etched into the auxiliary structure and filled with the insulating layer made of silicon nitride, for example, as spacer. As a result, it is possible to apply the oxidizing heat treatment at high temperatures to the BST. Only at the end is the spacer, made, for example, of silicon nitride, replaced by polycrystalline silicon.

We claim:

1. A method for fabricating a memory cell, which comprises:

forming a polycrystalline silicon layer on a semiconductor body having at least one selection transistor disposed in a first plane;

forming an interspace between two adjacent structures of the polycrystalline silicon layer;

placing one of the adjacent structures of the polycrystalline silicon layer on a surface of a first silicon plug;

forming a cell plate electrode in the interspace;

forming a trench in the polycrystalline silicon layer, the trench reaching as far as the surface of the first plug, and filling the trench with an insulating layer;

removing the polycrystalline silicon layer;

forming a storage capacitor having one of a high-epsilon and ferroelectric dielectric and a storage node electrode, the storage capacitor being disposed in a second plane in and, respectively, above the semiconductor body; and replacing the insulating layer with silicon to form a second silicon plug directly connected to the first plug, the second plug being electrically connected to the storage node electrode, and the first plane being electrically connected to the second plane through the first and second plugs.

2. The method according to claim 1, which further comprises forming a lateral edge web on a structure of the polycrystalline silicon layer.

3. The method according to claim 1, which further comprises forming a cell plate electrode from a conformal layer and a filling.

4. The method according to claim 2, which further comprises forming a cell plate electrode from a conformal layer and a filling.

5. The method according to claim 1, which further comprises forming the insulating layer from at least one of the group consisting of silicon oxide, silicon nitride, and silicon oxide-nitride.

6. The method according to claim 1, which further comprises forming at least one of the cell plate electrode and the storage node electrode by chemical vapor deposition.

7. The method according to claim 6, which further comprises performing the forming step by forming at least one of the cell plate electrode and the storage node electrode by depositing ruthenium by chemical vapor deposition.

8. The method according to claim 1, which further comprises forming at least one of the cell plate electrode and the storage node electrode by sputtering.

9. The method according to claim 8, which further comprises performing the forming step by forming at least one of the cell plate electrode and the storage node electrode by sputtering platinum.

10. A method for fabricating a memory cell, which comprises:

forming a memory cell having a semiconductor body with at least one selection transistor disposed in a first plane and a storage capacitor, the storage capacitor having a storage node electrode and one of a high-epsilon and ferroelectric dielectric, the storage capacitor being disposed in a second plane in and, respectively, above the semiconductor body, and electrically connecting the first plane to the second plane with a first silicon plug by adjoining the first plug to a second silicon plug and by electrically connecting the second plug to the storage node electrode, the forming step comprising the steps of:

forming a polycrystalline silicon layer on the semiconductor body, the polycrystalline silicon layer having an interspace between two adjacent structures of the polycrystalline silicon layer, one of the adjacent structures of the polycrystalline silicon layer being disposed on a surface of the first plug;

forming a cell plate electrode in the interspace;

forming a trench in the polycrystalline silicon layer, the trench reaching as far as the surface of the first plug, and filling the trench with an insulating layer;

removing the polycrystalline silicon layer;

forming the dielectric and the storage node electrode; and replacing the insulating layer with silicon to form the second plug directly connected to the first plug.

* * * * *